(12) United States Patent
Hao et al.

(10) Patent No.: US 10,573,224 B2
(45) Date of Patent: Feb. 25, 2020

(54) SHIFT REGISTER UNIT AND DRIVING METHOD THEREOF, GATE DRIVING CIRCUIT AND DISPLAY DEVICE TO REDUCE DRIFT OF POTENTIAL OF A PULL-DOWN NODE WHEN THE POTENTIAL IS RISEN

(71) Applicant: BOE TECHNOLOGY GROUP CO., LTD., Beijing (CN)

(72) Inventors: Xueguang Hao, Beijing (CN); Yongda Ma, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 15/506,398

(22) PCT Filed: Sep. 2, 2016

(86) PCT No.: PCT/CN2016/097915
§ 371 (c)(1),
(2) Date: Feb. 24, 2017

(87) PCT Pub. No.: WO2017/107555
PCT Pub. Date: Jun. 29, 2017

(65) Prior Publication Data
US 2018/0108291 A1    Apr. 19, 2018

(30) Foreign Application Priority Data

Dec. 24, 2015 (CN) .......................... 2015 1 0983061

(51) Int. Cl.
*G06F 3/041* (2006.01)
*G09G 3/20* (2006.01)
(Continued)

(52) U.S. Cl.
CPC ......... *G09G 3/2092* (2013.01); *G06F 3/0416* (2013.01); *G06F 3/0418* (2013.01);
(Continued)

(58) Field of Classification Search
CPC .......... G06F 3/0416; G09G 2310/0286; G09G 2310/0289; G09G 2310/061;
(Continued)

(56) References Cited

U.S. PATENT DOCUMENTS 7,741,883 B2 * 6/2010 Fuller .................. H03K 17/284
327/108
2010/0182227 A1 7/2010 Tsou
(Continued)

FOREIGN PATENT DOCUMENTS

CN    101093647 A    12/2007
CN    103366704 A    10/2013
(Continued)

OTHER PUBLICATIONS

International Search Report dated Nov. 30, 2016 issued in corresponding International Application No. PCT/CN2016/097915 along with an English translation of the Written Opinion of the International Searching Authority.

*Primary Examiner* — Ram A Mistry
(74) *Attorney, Agent, or Firm* — Nath, Goldberg & Meyer; Joshua B. Goldberg; Daniel Bissing

(57) ABSTRACT

The invention provides a shift register unit, including a pull-up node, a pull-down node, a low-level signal terminal, a second clock signal terminal and a pull-down module, the second clock signal terminal supplies a high-level signal during an input sub-period and a pull-down sub-period, the pull-down module is connected to the pull-up node, the pull-down node, an output terminal of the shift register unit and the low-level signal terminal, the shift register unit
(Continued)

further includes a discharging module, which is configured to make the pull-down node and the low-level signal terminal be connected in a conducting path during the input sub-period, and both the pull-up node and the output terminal of the shift register unit are connected with the low-level signal terminal in conducting paths during the input sub-period and the pull-down sub-period.

17 Claims, 3 Drawing Sheets

(51) Int. Cl.
    *G11C 19/28*     (2006.01)
    *G11C 7/02*     (2006.01)
    *G09G 3/3266*     (2016.01)
    *G09G 3/36*     (2006.01)

(52) U.S. Cl.
    CPC ............... *G11C 7/02* (2013.01); *G11C 19/28* (2013.01); *G09G 3/3266* (2013.01); *G09G 3/3674* (2013.01); *G09G 2310/0286* (2013.01); *G09G 2310/0289* (2013.01); *G09G 2310/061* (2013.01); *G09G 2310/08* (2013.01); *G09G 2354/00* (2013.01)

(58) Field of Classification Search
    CPC ........... G09G 2310/08; G09G 2354/00; G09G 3/2092; G11C 19/28
    See application file for complete search history.

(56) References Cited

U.S. PATENT DOCUMENTS

| | | | | |
|---|---|---|---|---|
| 2010/0253638 | A1* | 10/2010 | Yousefpor | G06F 3/0412 345/173 |
| 2011/0058640 | A1* | 3/2011 | Shang | G11C 19/184 377/64 |
| 2012/0051494 | A1 | 3/2012 | Yang et al. | |
| 2012/0262438 | A1* | 10/2012 | Shang | G11C 19/28 345/211 |

FOREIGN PATENT DOCUMENTS

| | | |
|---|---|---|
| CN | 103680636 A | 3/2014 |
| CN | 103700356 A | 4/2014 |
| CN | 104715734 A | 6/2015 |
| CN | 105374314 A | 3/2016 |

* cited by examiner

SHIFT REGISTER UNIT AND DRIVING METHOD THEREOF, GATE DRIVING CIRCUIT AND DISPLAY DEVICE TO REDUCE DRIFT OF POTENTIAL OF A PULL-DOWN NODE WHEN THE POTENTIAL IS RISEN

This is a National Phase Application filed under 35 U.S.C. 371 as a national stage of PCT/CN2016/097915, filed Sep. 2, 2016, an application claiming the benefit of Chinese Application No. 201510983061.9, filed Dec. 24, 2015, the content of each of which is hereby incorporated by reference in its entirety.

FIELD OF THE INVENTION

The present invention relates to the field of display technology, and in particular, relates to a shift register unit and a driving method thereof, and a display device.

BACKGROUND OF THE INVENTION

A gate driving circuit of a display device includes a plurality of shift register units, which are cascaded and output scanning signals sequentially. Each register unit includes a plurality of thin film transistors. During an output period of operation of the shift register unit, a pull-up node is at a high level, to control a pull-up module connected to the pull-up node to be turned on so that an output terminal of the shift register unit outputs a signal at a high level; during periods other than the output period (such as an input period and a pull-down period), a pull-down node is at a high level, to control a pull-down module connected to the pull-down node to be turned on so that the signal at the output terminal of the shift register unit is pulled down to be at a low level.

In order to cause the shift register unit to output signals at a low level during the input period and the pull-down period, a signal at a high level is generally input to the pull-down node through a clock signal terminal so that a pull-down transistor controlled by the pull-down node is turned on during the input period and the pull-down period. However, in this case, potential of the pull-down node may directly rise from a low level to a high level, which will cause the potential of the pull-down node to be unstable and easily drift, so that the pull-down module controlled by the pull-down node operates unstably, and noise easily occurs in the shift register unit during periods other than the output period (such as an input period).

SUMMARY OF THE INVENTION

An object of the invention is to provide a shift register unit and a driving method thereof, a gate driving circuit and a display device, so as to reduce drift of potential of the pull-down node when the potential is risen.

In order to achieve the above object, the invention provides a shift register unit, comprising a pull-up node, a pull-down node, a low-level signal terminal, a second clock signal terminal and a pull-down module, wherein the second clock signal terminal supplies a high-level signal to the pull-down node during an input sub-period and a pull-down sub-period of the shift register unit, and the pull-down module is connected to the pull-up node, the pull-down node, an output terminal of the shift register unit and the low-level signal terminal, and wherein the shift register unit further comprises a discharging module, which is connected to the pull-down node and the low-level signal terminal and configured to make the pull-down node and the low-level signal terminal be connected in a conducting path during the input sub-period, and with a potential of the pull-down node, the pull-down module makes both the pull-up node and the output terminal of the shift register unit connect with the low-level signal terminal in conducting paths during the input sub-period and the pull-down sub-period.

Optionally, the pull-down module comprises a first pull-down transistor and a second pull-down transistor, a first electrode of the first pull-down transistor is connected to the pull-up node, a first electrode of the second pull-down transistor is connected to the output terminal of the shift register unit, both a gate of the first pull-down transistor and a gate of the second pull-down transistor are connected to the pull-down node, and both a second electrode of the first pull-down transistor and a second electrode of the second pull-down transistor are connected to the low-level signal terminal, and the discharging module is also connected to at least one of an input terminal of the shift register unit and the pull-up node, and when the at least one of the input terminal of the shift register unit and the pull-up node connected to the discharging module supplies a high-level signal to the discharging module, the discharging module is able to make the pull-down node and the low-level signal terminal be connected in a conducting path.

Optionally, the discharging module comprises a first discharging transistor and a second discharging transistor, a gate of the first discharging transistor is connected to an input terminal of the shift register unit, a gate of the second discharging transistor is connected to the pull-up node, both a first electrode of the first discharging transistor and a first electrode of the second discharging transistor are connected to the pull-down node, and both a second electrode of the first discharging transistor and a second electrode of the second discharging transistor are connected to the low-level signal terminal.

Optionally, the shift register unit further comprises a pull-down node charging module having an internal resistor, wherein an input terminal of the pull-down node charging module is connected to the second clock signal terminal and an output terminal of the pull-down node charging module is connected to the pull-down node.

Optionally, the pull-down node charging module comprises a charging transistor, a gate and a first electrode of the charging transistor are connected to each other and act as an input terminal of the pull-down node charging module, and a second electrode of the charging transistor acts as an output terminal of the pull-down node charging module.

Optionally, the shift register unit further comprises a pull-up module and a first clock signal terminal, a first terminal of the pull-up module is connected to the pull-up node, a second terminal of the pull-up module is connected to the first clock signal terminal, a third terminal of the pull-up module is connected to the output terminal of the shift register unit, and when a high-level signal is received by the first terminal of the pull-up module, the second and third terminals of the pull-up module are connected in a conducting path; and the shift register unit further comprises a storage module arranged between the pull-up node and the output terminal of the shift register unit, and the storage module is configured to make potentials between the pull-up node and the output terminal of the shift register unit during the input sub-period and an output sub-period after the input sub-period be identical when a high-level signal is input to the first clock signal terminal.

Optionally, the pull-up module comprises a first pull-up transistor and a second pull-up transistor, a gate of the first pull-up transistor and a gate of the second pull-up transistor are connected to each other and act as a first terminal of the pull-up module, a first electrode of the first pull-up transistor and a first electrode of the second pull-up transistor are connected to each other and act as a second terminal of the pull-up module, and a second electrode of the first pull-up transistor and a second electrode of the second pull-up transistor are connected to each other and act as a third terminal of the pull-up module;

the storage module comprises a coupling capacitor formed between the gate and the second electrode of the first pull-up transistor and a coupling capacitor formed between the gate and the second electrode of the second pull-up transistor.

Optionally, the storage module further comprises a storage capacitor, a first terminal of the storage capacitor is connected to the pull-up node, and a second terminal of the storage capacitor is connected to the output terminal of the shift register unit.

Optionally, the shift register unit further comprises an input module, wherein the input module is connected to an input terminal and the pull-up node of the shift register unit to charge the pull-up node during the input sub-period.

Optionally, the input module comprises an input transistor, both a gate and a first electrode of the input transistor are connected to the input terminal of the shift register unit, and a second electrode of the input transistor is connected to the pull-up node.

Optionally, the shift register unit further comprises a reset module, which is configured to reset the pull-up node and the output terminal of the shift register unit during a reset sub-period before start of the input sub-period.

Optionally, the reset module comprises a first reset transistor and a second reset transistor, both a gate of the first reset transistor and a gate of the second reset transistor are connected to a reset terminal of the shift register unit, a first electrode of the first reset transistor is connected to the pull-up node, a second electrode of the first reset transistor is connected to the low-level signal terminal, a first electrode of the second reset transistor is connected to the output terminal of the shift register unit, and a second electrode of the second reset transistor is connected to the first electrode of the first reset transistor.

Optionally, the reset module comprises a first reset transistor, a second reset transistor and a normally-on transistor, both a gate of the first reset transistor and a gate of the second reset transistor are connected to a reset terminal of the shift register unit, a gate of the normally-on transistor is connected to a high-level signal terminal, a first electrode of the normally-on transistor is connected to the pull-up node, a second electrode of the normally-on transistor is connected to a first electrode of the first reset transistor, a second electrode of the first reset transistor is connected to the low-level signal terminal, a first electrode of the second reset transistor is connected to the output terminal of the shift register unit, and a second electrode of the second reset transistor is connected to the first electrode of the normally-on transistor.

Optionally, the shift register unit further comprises a touch noise-reduction module, a first terminal of the touch noise-reduction module is connected to a touch enable terminal which is able to supply a high-level signal during a touch period, a second terminal of the touch noise-reduction module is connected to the output terminal of the shift register unit, a third terminal of the touch noise-reduction module is connected to the low-level signal terminal, and when the first terminal of the touch noise-reduction module receives a high-level signal, the second and third terminals of the touch noise-reduction module are connected in a conducting path.

Optionally, the touch noise-reduction module comprises a first noise-reduction transistor, a gate of the first noise-reduction transistor acts as the first terminal of the touch noise-reduction module, a first electrode of the first noise-reduction transistor acts as the second terminal of the touch noise-reduction module, and a second electrode of the first noise-reduction transistor acts as the third terminal of the touch noise-reduction module.

Optionally, the touch noise-reduction module further comprises a second noise-reduction transistor, a gate of the second noise-reduction transistor is connected to the gate of the first noise-reduction transistor, a first electrode of the second noise-reduction transistor is connected to the first electrode of the first noise-reduction transistor, and a second electrode of the second noise-reduction transistor is connected to the second electrode of the first noise-reduction transistor.

Accordingly, the invention further provides a driving method of the shift register unit, comprising:

during an input sub-period, supplying a high-level signal to the input terminal of the shift register unit, supplying a high-level signal to the pull-down node of the shift register unit by the second clock signal terminal, making the pull-down node and the low-level signal terminal be connected in a conducting path, and making both the pull-up node and the output terminal of the shift register unit be connected with the low-level signal terminal in conducting paths;

during an output sub-period after the input sub-period, supplying a high-level signal to the first clock signal terminal of the shift register unit to pull potential of the output terminal of the shift register unit up to be at a high level; and during a pull-down sub-period after the output sub-period, supplying a high-level signal to the second clock signal terminal, and making both the pull-up node and the output terminal of the shift register unit be connected with the low-level signal terminal in conducting paths.

Optionally, the driving method further comprises:

during a reset sub-period before the input sub-period, supplying a high-level signal to the reset terminal of the shift register unit, so as to reset the pull-up node and the output terminal of the shift register unit.

Optionally, the driving method further comprises;

during a touch period, making the output terminal and the low-level signal terminal of the shift register unit be connected in a conducting path.

Accordingly, the invention further provides a gate driving circuit, comprising a plurality of stages of shift register units which are cascaded, wherein the shift register unit is the above shift register unit provided by the invention.

Optionally, in continuous three stages of shift register units, an input terminal of a third stage of shift register unit is connected to an output terminal of a second stage of shift register unit, and a reset terminal of the third stage of shift register unit is connected to an output terminal of the first stage of shift register unit.

Accordingly, the invention further provides a display device, comprising the above gate driving circuit provided by the invention.

Optionally, the display device further comprises a touch driving electrode, a touch sensing electrode and a touch circuit which is configured to sense a touch position during the touch period;

the shift register unit further comprises a touch noise-reduction module, a first terminal of the touch noise-reduction module is connected to a touch enable terminal which is able to supply a high-level signal during the touch period, a second terminal of the touch noise-reduction module is connected to the output terminal of the shift register unit, a third terminal of the touch noise-reduction module is connected to the low-level signal terminal, and when the first terminal of the touch noise-reduction module receives a high-level signal, the second and third terminals of the touch noise-reduction module are connected in a conducting path.

In the invention, the pull-down node of the shift register unit is connected to the discharging module. During the input sub-period, since the discharging module can make the pull-down node and the low-level signal terminal be connected in a conducting path to discharge the pull-down node. That is, during the input sub-period, when a high-level signal is input to the second clock signal terminal to charge the pull-down node, the discharging module can also discharge the pull-down node. Thus, during the input sub-period, the potential of the pull-down node is risen from the low level to a potential lower than that of the high-level signal at the second clock signal terminal, to eliminate instability of the potential of the pull-down node due to the fact that the pull-down node directly receives the high-level signal, thus eliminate drift of the potential of the pull-down node and increase stability of the operation of the pull-down module, so that a signal at a low level is stably output from the output terminal of the shift register unit, and noise is effectively suppressed.

BRIEF DESCRIPTION OF THE DRAWINGS

The drawings are used to provide further understanding of the present invention, constitute a part of the specification, and used to interpret the present invention together with the following detailed embodiments, but not to limit the present invention. In the drawings.

DETAILED DESCRIPTION OF THE EMBODIMENTS

Exemplary embodiments of the invention will be described in detail below with reference to the accompanying drawings. It should be understood that, the embodiments described below are for the purpose of explaining and interpreting the present invention, rather than limiting the scope of the present invention.

Figure 1:
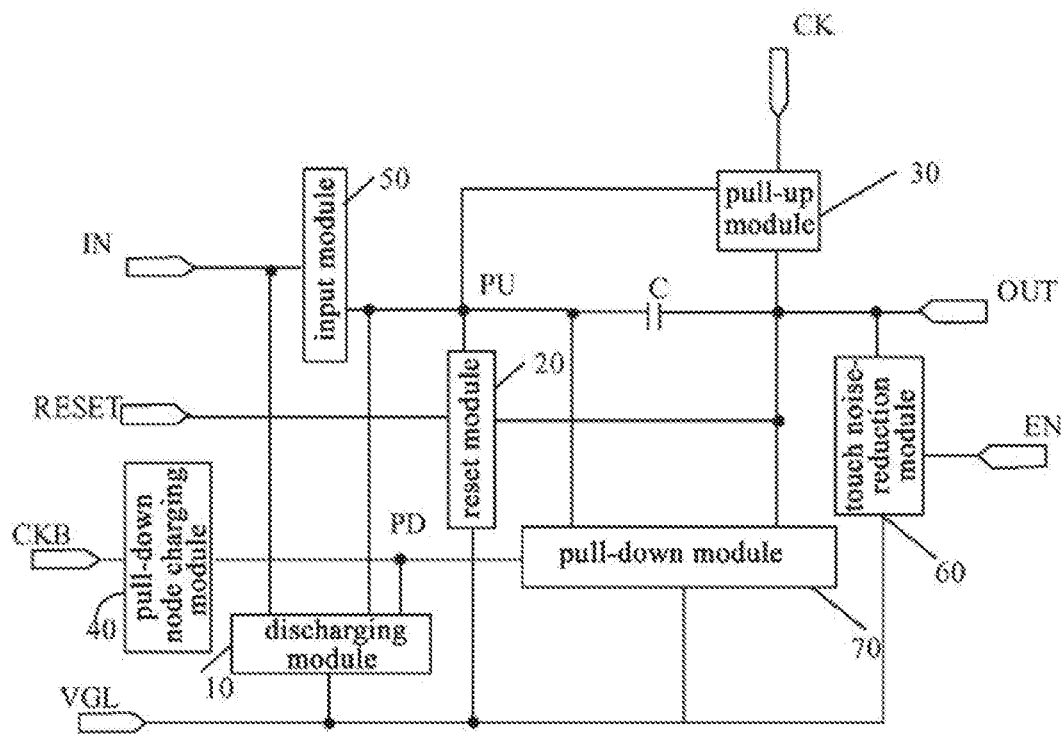
FIG. 1 is a block diagram of a structure of a shift register unit provided by the invention.

An aspect of the invention provides a shift register unit as shown in FIG. 1, and the shift register unit includes a pull-down node PD, a pull-up node PU, a low-level signal terminal VGL, a second clock signal terminal CKB and a pull-down module 70. The second clock signal terminal CKB supplies a high-level signal to the pull-down node PD during an input sub-period and a pull-down sub-period of the shift register unit, the pull-down module 70 is connected to the pull-up node PU, the pull-down node PD, an output terminal OUT of the shift register unit and the low-level signal terminal VGL so that the pull-down node PD and the low-level signal terminal VGL are connected in a conducting path during the input sub-period, and with a potential of the pull-down node PD, the pull-down module 70 can make both the pull-up node PU and the output terminal OUT of the shift register unit be connected with the low-level signal terminal VGL in conducting paths during the input sub-period and the pull-down sub-period.

It should be understood by a person skilled in the art that, the shift register unit has a reset sub-period (t1 sub-period in FIG. 4), an input sub-period (t2 sub-period in FIG. 4), an output sub-period (t3 sub-period in FIG. 4), and a pull-down sub-period (t4 sub-period in FIG. 4), and the pull-down module 70 is configured to pull down potentials of the pull-up node PU and the output terminal OUT of the shift register unit during the input sub-period before the output sub-period and the pull-down sub-period after the output sub-period. A first terminal of the pull-down module 70 is connected to the pull-down node PD, a second terminal of the pull-down module 70 is connected to the pull-up node PU, a third terminal of the pull-down module 70 is connected to the output terminal OUT of the shift register unit, and a fourth terminal of the pull-down module 70 is connected to the low-level signal terminal VGL, and when the potential of the pull-down node PD reaches to be at a high level, both the second terminal and the third terminal of the pull-down module 70 are connected with the fourth terminal in conducting paths, so as to pull down the potentials of the pull-up node PU and the output terminal OUT of the shift register unit.

In the prior art, during the input sub-period and the pull-down sub-period of the shift register unit, a high-level signal is input to the second clock signal terminal CKB, so as to pull the potential of the pull-down node PD directly up to a high level from a low level, causing the potential of the pull-down node PD to be unstable and thus causing operation of the pull-down module controlled by the pull-down node PD to be unstable.

However, in the embodiment of the invention, the pull-down node PD of the shift register unit is connected to a discharging module 10, and during the input sub-period, since the discharging module 10 can make the pull-down node PD and the low-level signal terminal VGL be connected in a conducting path, so as to discharge the pull-down node PD. That is, during the input sub-period, while the high-level signal is input to the second signal terminal CKB to charge the pull-down node PD, the discharging module 10 can also discharge the pull-down node PD. Thus, during the input sub-period, the potential of the pull-down node PD is risen to a potential lower than that of the high-level signal at the second clock signal terminal CKB, so as to eliminate the problem that the potential of the pull-down node PD is unstable due to the fact that the pull-down node PD directly receives the high-level signal at the second clock signal terminal, reduce drift of potential of the pull-down node PD, and increase stability of operation of the pull-down module, so that the a low-level signal is more stably output from the output terminal OUT of the shift register unit, and noise is effectively suppressed.

Figure 2:
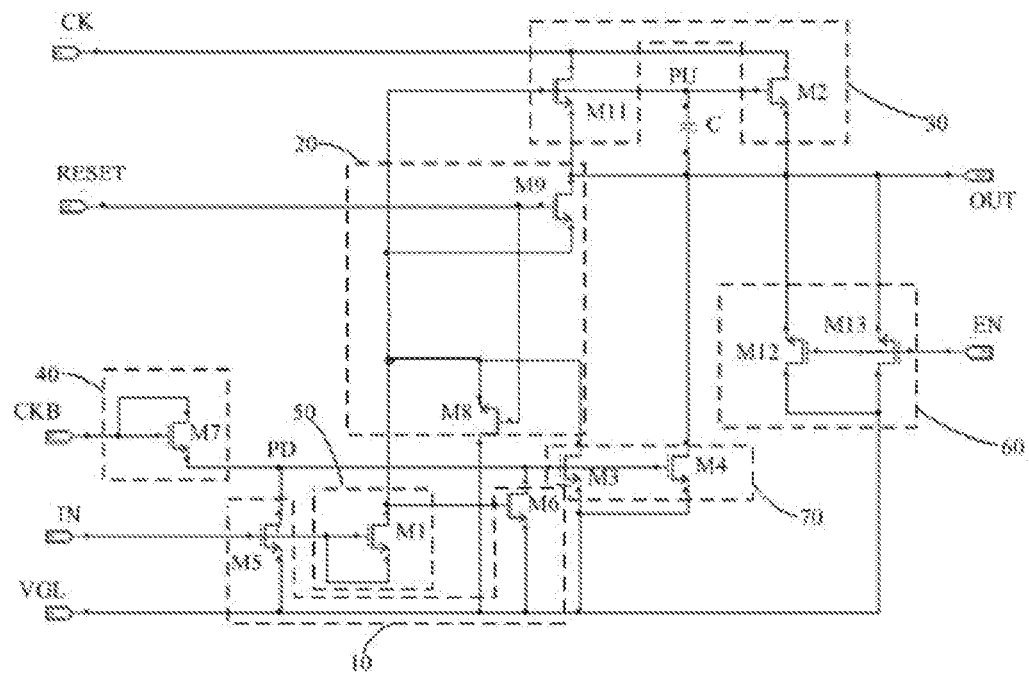
FIG. 2 is a schematic view of a structure of a shift register unit according to an embodiment of the invention.
Figure 3:
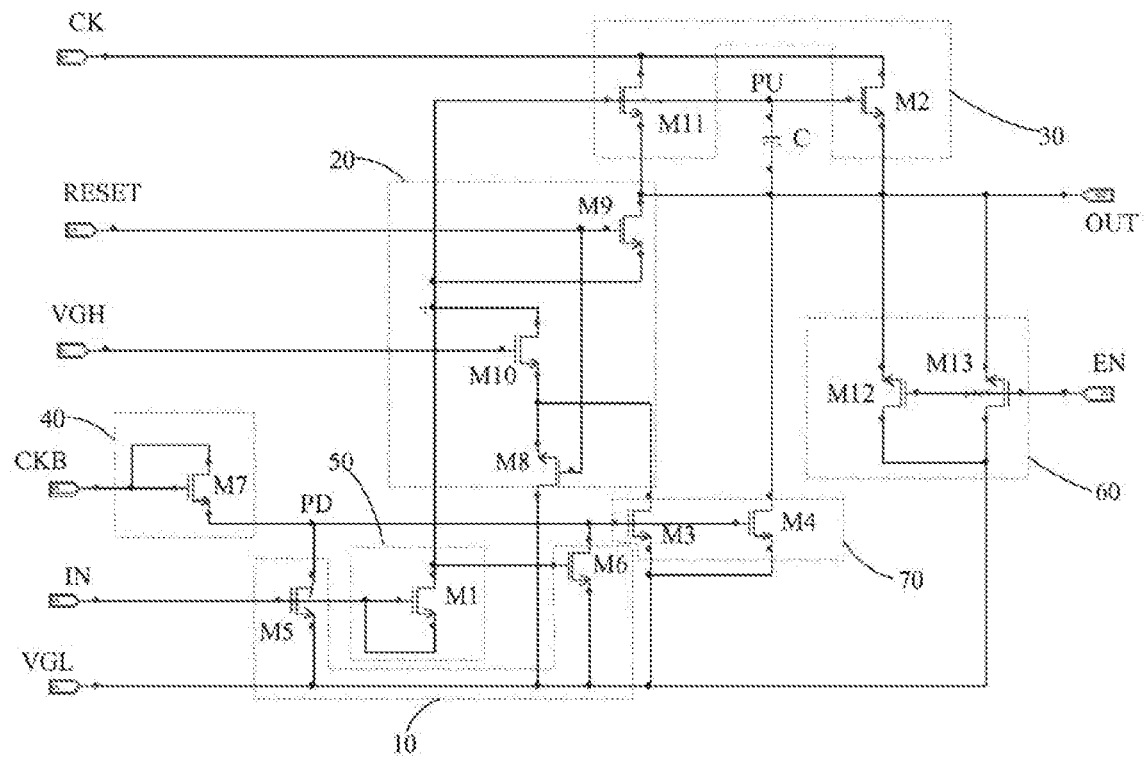
FIG. 3 is a schematic view of a structure of a shift register unit according to another embodiment of the invention.

In particular, as shown in FIGS. 2 and 3, the pull-down module 70 comprises a first pull-down transistor M3 and a second pull-down transistor M4, a first electrode of the first pull-down transistor M3 is connected to the pull-up node PU, a first electrode of the second pull-down transistor M4 is connected to the output terminal OUT of the shift register unit, both a gate of the first pull-down transistor M3 and a gate of the second pull-down transistor M4 are connected to the pull-down node PD, and both a second electrode of the first pull-down transistor M3 and a second electrode of the second pull-down transistor M4 are connected to the low-level signal terminal VGL.

The discharging module 10 is further connected to at least one of an input terminal IN of the shift register unit and the pull-up node PU, and when the at least one of the input terminal IN of the shift register unit and the pull-up node PU supplies a high-level signal to the discharging module 10, the discharging module 10 is able to make the pull-down node PD and the low-level signal terminal VGL be connected in a conducting path. As such, when the discharging module 10 is connected to the input terminal IN, during the input sub-period, a high-level signal is input to the input terminal IN, the pull-down node PD is connected with the low-level signal terminal VGL in a conducting path by the discharging module 10, and at the same time the second clock signal terminal CKB supplies a high-level signal to the pull-down node PD, so that the potential of the pull-down node PD during the input sub-period is risen to a potential lower than that of the high-level signal at the second clock signal terminal CKB. When the discharging module 10 is connected to the pull-up node PU, during the input sub-period, the input terminal IN charges the pull-up node PU, the potential of the pull-up terminal PU is risen, and under the control of the high-level potential of the pull-up node PU, the pull-up module 10 can also make the pull-down node PD and the low-level signal terminal VGL be connected in a conducting path, so that the potential of the pull-down node PD during the input sub-period is lower than the high-level potential of the second clock signal terminal CKB; in addition, during the output sub-period, a low-level signal is input to the second clock signal terminal CKB, and the potential of the pull-up node PU is still at a high level, and at this time the discharging module 10 makes the pull-down node PD and the low-level signal terminal VGL be connected in a conducting path so as to pull the potential of the pull-down node PD down to a low level, so that the first pull-down transistor M3 and the second pull-down transistor M4 are turned off, and the shift register unit outputting a high-level signal is not affected.

Further, as shown in FIGS. 2 and 3, the discharging module 10 comprises a first discharging transistor M5 and a second discharging transistor M6, a gate of the first discharging transistor M5 is connected to the input terminal IN of the shift register unit, a gate of the second discharging transistor M6 is connected to the pull-up node PU, both a first electrode of the first discharging transistor M5 and a first electrode of the second discharging transistor M6 are connected to the pull-down node PD, and both a second electrode of the first discharging transistor M5 and a second electrode of the second discharging transistor M6 are connected to the low-level signal terminal VGL.

Further, as shown in FIGS. 1 to 3, the shift register unit further comprises a pull-down node charging module 40 having an internal resistor, an input terminal of the pull-down node charging module 40 is connected to the second clock signal terminal CKB and an output terminal of the pull-down node charging module 40 is connected to the pull-down node PD. Thus, when a high-level signal is input to the second clock terminal CKB, the pull-down node charging module 40 serves as a voltage divider, so as to prevent the problem, that the potential of the pull-down node PD is unstable due to the fact that the high-level signal input to the second clock signal terminal CKB is directly charged to the pull-down node PD, from occurring, and thus increase stability of operation of the pull-down module.

In particular, as shown in FIGS. 2 and 3, the pull-down node charging module 40 includes a charging transistor M7, a gate and a first electrode of the charging transistor M7 are connected to each other and act as an input terminal of the pull-down node charging module 40, and a second electrode of the charging transistor M7 acts as an output terminal of the pull-down node charging module 40. That is, both the gate and the first electrode of the charging transistor M7 are connected to the second clock signal terminal CKB, and the second electrode of the charging transistor M7 is connected to the pull-down node PD. During the input sub-period, the charging transistor M7 and the first discharging transistor M5 are connected in series to divide a voltage of the high-level signal input to the second clock signal terminal CKB, so that the potential of the pull-down node PD is lower than that of the high-level signal, and a voltage between the pull-down node PD and the second electrode of the first pull-down transistor M3 is larger than a threshold voltage of the first pull-down transistor M3, so as to prevent drift of the potential of the pull-down node PD when it is directly risen to a high level from a low level, so as to increase stability of the operation of the pull-down module 70. Similarly, during the pull-down sub-period, the charging transistor M7 and the second discharging transistor M6 are connected in series to divide the voltage of the high-level signal of the second clock signal terminal CKB, thus increasing stability of operation of the pull-down module 70.

As shown in FIGS. 1 to 3, the shift register unit further comprises a pull-up module 30 and a first clock signal terminal CK, a first terminal of the pull-up module 30 is connected to the pull-up node PU, a second terminal of the pull-up module 30 is connected to the first clock signal terminal OK, a third terminal of the pull-up module 30 is connected to the output terminal OUT of the shift register unit, and when a high-level signal is received by the first terminal of the pull-up module 30, the second and third terminals of the pull-up module 30 are connected in a conducting path. During the output sub-period, a high-level signal is input to the first clock signal terminal OK so that a high-level signal is output by the output terminal OUT of the shift register unit during the output sub-period. A storage module is arranged between the pull-up node PU and the output terminal OUT of the shift register unit, to make potentials between the pull-up node PU and the output terminal OUT of the shift register unit during the input sub-period and the output sub-period be identical.

In particular, as shown in FIGS. 2 and 3, the pull-up module 30 comprises a first pull-up transistor M2 and a second pull-up transistor M11, a gate of the first pull-up transistor M2 and a gate of the second pull-up transistor M11 are connected to each other and act as a first terminal of the pull-up module 30, a first electrode of the first pull-up transistor M2 and a first electrode of the second pull-up transistor M11 are connected to each other and act as a second terminal of the pull-up module 30, and a second electrode of the first pull-up transistor M2 and a second electrode of the second pull-up transistor M11 are connected to each other and act as a third terminal of the pull-up module 30. That is, both the gate of the first pull-up transistor M2 and the gate of the second pull-up transistor M11 are connected to the pull-up node PU, both the first electrode of the first pull-up transistor M2 and the first electrode of the second pull-up transistor M11 are connected to the first clock signal terminal CK, and both the second electrode of the first pull-up transistor M2 and the second electrode of the second pull-up transistor M11 are connected to the output terminal OUT of the shift register unit.

Thus, during the output sub-period (t3 sub-period in FIG. 4), the pull-up node PU is at a high level to control the first pull-up transistor M2 and the second pull-up transistor M11 to be turned on simultaneously, the high-level signal at the first clock signal terminal CK is output to the output terminal OUT of the shift register unit, the first pull-up transistor M2 and the second pull-up transistor M11 together increases reliability that a high-level signal is output by the output terminal OUT, without affecting output of the output terminal OUT when one of the first pull-up transistor M2 and the second pull-up transistor M11 becomes fault.

Moreover, during the output sub-period, since a low-level signal is input to the second clock signal terminal CKB, the pull-up node PU is at a high level, thus the second discharging transistor M6 is turned on to pull the pull-down node PD down to be at a low level, and the first pull-down transistor M3 and the second pull-down transistor M4 are turned off, to prevent potentials of the pull-up node PU and the output terminal OUT of the shift register unit from being pulled down.

When the pull-up module 30 includes the first pull-up transistor M2 and the second pull-up transistor M11, the storage module may include a coupling capacitor formed between the gate and the second electrode of the first pull-up transistor M2 and a coupling capacitor formed between the gate and the second electrode of the second pull-up transistor M11, which may maintain the voltage between the pull-up node PU and the output terminal OUT of the shift register unit to be unchanged from the input sub-period to the output sub-period. Thus, during the output sub-period, under the bootstrap effect of the coupling capacitors, the potential of the pull-up node PU is further increased; during the output sub-period, the high-level signal at the pull-up node PU controls the second discharging transistor M6 to be rapidly turned on to discharge the pull-down node PD, thus preventing the second pull-down transistor M4 from being turned on during the output sub-period to affect output of the output terminal OUT of the shift register unit.

Further, the storage module may further include a storage capacitor C, a first terminal of the storage capacitor C is connected to the pull-up node PU, and a second terminal of the storage capacitor C is connected to the output terminal OUT of the shift register unit.

Further, as shown in FIGS. 2 and 3, the shift register unit further includes an input module 50, and the input module 50 is connected to an input terminal IN and the pull-up node PU of the shift register unit to charge the pull-up node based on a signal at the input terminal IN of the shift register unit during the input sub-period.

In particular, the input module 50 includes an input transistor M1, both a gate and a first electrode of the input transistor M1 are connected to the input terminal IN of the shift register unit, and a second electrode of the input transistor M1 is connected to the pull-up node PU. During the input sub-period, a high-level signal is input to the input terminal IN of the shift register unit to control the input transistor M1 to be turned on to charge the pull-up node PU.

During the input sub-period (t2 sub-period in FIG. 4), a high-level signal is input to the input terminal IN of the shift register unit, a low-level signal is input to the first clock signal terminal CK, and a high-level signal is input to the second clock signal terminal CKB. The input transistor M1 is turned on, the input terminal IN charges the pull-up node PU, the second clock signal terminal CKB supplies a high-level signal to the pull-down node PD, and the first discharging transistor M5 is turned on to discharge the pull-down node PD. It should be understood that, the rate at which the second clock signal terminal CKB charges the pull-down node PD is larger than the discharging rate of the first discharging transistor M5 so that the potential of the pull-down node PD is smaller than that of the high-level signal supplied by the second clock signal terminal CKB and larger than the threshold voltage of the second pull-down transistor M4 to make the second pull-down transistor M4 be turned on, and a low-level signal is output from the output terminal OUT of the shift register unit.

As shown in FIGS. 1 to 3, the shift register unit further includes a reset module 20, which is configured to reset the pull-up node PU and the output terminal OUT of the shift register unit during a reset sub-period before start of the input sub-period.

In an embodiment of the invention, as shown in FIG. 2, the reset module 20 comprises a first reset transistor M8 and a second reset transistor M9, both a gate of the first reset transistor M8 and a gate of the second reset transistor M9 are connected to a reset terminal RESET of the shift register unit, a first electrode of the first reset transistor M8 is connected to the pull-up node PU, a second electrode of the first reset transistor M8 is connected to the low-level signal terminal VGL, a first electrode of the second reset transistor M9 is connected to the output terminal OUT of the shift register unit, and a second electrode of the second reset transistor M9 is connected to the first electrode of the first reset transistor M8.

In the embodiment, during the reset sub-period (t1 sub-period in FIG. 4), a high-level signal is input to the reset terminal RESET, and the first reset transistor M8 and the second reset transistor M9 are turned on, to make the pull-up node PU and the output terminal OUT of the shift register unit be connected with the low-level signal terminal VGL in conducting paths and pull down potentials of the pull-up node PU and the output terminal OUT.

Moreover, as mentioned above, during the input sub-period, the first pull-down transistor M3 is turned on to pull down the potential of the pull-up node PU. At the same time, the pull-up node PU is charged by the input terminal IN via the input transistor M1, which is equivalent to the case that the input transistor M1 and the first pull-down transistor M3 are connected in series to divide the voltage of the high-level signal at the input terminal IN so that the voltage between the pull-up node PU and the output terminal OUT of the shift register unit is larger the threshold voltages of the first pull-up transistor M2 and the second pull-up transistor M11, and smaller than that of the high-level signal at the input terminal IN. since the input transistor M1 and the first pull-down transistor M3 acts as voltage dividers, during the potential of the pull-up node PU is risen, it is not directly risen to the high level at the input terminal IN from the low level, but risen to a value lower than the high level, thus increasing stability of the potential of the pull-up node PU and in turn increasing stability of operations of the first pull-up transistor M2 and the second pull-up transistor M11.

In an embodiment of the invention, as shown in FIG. 3, the reset module 20 comprises a first reset transistor M8, a second reset transistor M9 and a normally-on transistor M10, both a gate of the first reset transistor M8 and a gate of the second reset transistor M9 are connected to a reset terminal RESET of the shift register unit, a gate of the normally-on transistor M10 is connected to a high-level signal terminal VGH, a first electrode of the normally-on transistor M10 is connected to the pull-up node PU, a second electrode of the normally-on transistor M10 is connected to a first electrode of the first reset transistor M8, a second electrode of the first reset transistor M8 is connected to the low-level signal terminal VGL, a first electrode of the second reset transistor M9 is connected to the output terminal OUT of the shift register unit, and a second electrode of the second reset transistor M9 is connected to the first electrode of the normally-on transistor M10.

Similar to the above embodiment, in the current embodiment, during the reset sub-period, a high-level signal is input to the reset terminal RESET, the first reset transistor M8 and the second reset transistor M9 are turned on, and the normally-on transistor M10 maintains to be turned on under the control of the high-level signal terminal VGH. Thus, both the pull-up node PU and the output terminal OUT of the shift register unit are connected with the low-level signal terminal VGL in conducting paths to pull down potentials of the pull-up node PU and the output terminal OUT of the shift register unit.

Different from the above embodiment, in the current embodiment, during the input sub-period, the pull-up node PU is charged by the input terminal IN via the input transistor M1, which is equivalent to the case that the first pull-down transistor M3 and the normally-on transistor M10 are connected in series, and then are connected to the input transistor M1 in series, to divide the voltage of the high-level signal at the input terminal IN, which has a better voltage dividing effect and can make the potential of the pull-up node PU more stable.

Further, as shown in FIGS. 1 to 3, the shift register unit further includes a touch noise-reduction module 60, a first terminal of the touch noise-reduction module 60 is connected to a touch enable terminal EN which is able to supply a high-level signal during a touch period, a second terminal of the touch noise-reduction module 60 is connected to the output terminal OUT of the shift register unit, a third terminal of the touch noise-reduction module 60 is connected to the low-level signal terminal VGL, and when the first terminal of the touch noise-reduction module 60 receives a high-level signal, the second and third terminals of the touch noise-reduction module 60 are connected in a conducting path, so that the output terminal OUT of the shift register unit is connected with the low-level single terminal VGL in a conducting path during the touch period, preventing noise from generating and affecting the touch sensitivity during the touch period.

Thus, the above shift register unit may be used in a driving circuit of a touch display device. While each frame of image is displayed, during the output sub-period of the shift register unit, a high-level signal is output from the output terminal OUT of the shift register unit to scan a corresponding gate line; during sub-periods other than the output period in the display period, a low-level signal is output from the shift register unit; during a touch period between displaying two adjacent frames of images, a high-level signal is input to the touch enable terminal EN and a touch circuit of the display device determines a touch position, and at this time, the touch noise-reduction module 60 is turned on to prevent noise from generating and affecting the touch sensitivity during the touch period In particular, as shown in FIGS. 2 and 3, the touch noise-reduction module 60 comprises a first noise-reduction transistor M12, a gate of the first noise-reduction transistor M12 acts as the first terminal of the touch noise-reduction module 60, a first electrode of the first noise-reduction transistor M12 acts as the second terminal of the touch noise-reduction module 60, and a second electrode of the first noise-reduction transistor M12 acts as the third terminal of the touch noise-reduction module 60. That is, the gate of the first noise-reduction transistor M12 is connected to the touch enable terminal EN, the first electrode of the first noise-reduction transistor M12 is connected to the output terminal OUT of the shift register unit, and the second electrode of the first noise-reduction transistor M12 is connected to the low-level signal terminal VGL. During the touch period, the touch enable terminal EN supplies a high-level signal to make the first noise-reduction transistor M12 be turned on to prevent noise from generating during the touch period.

Alternatively, as shown in FIGS. 2 and 3, the touch noise-reduction module 60 further comprises a second noise-reduction transistor M13, a gate of the second noise-reduction transistor M13 is connected to the gate of the first noise-reduction transistor M12, a first electrode of the second noise-reduction transistor M13 is connected to the first electrode of the first noise-reduction transistor M12, and a second electrode of the second noise-reduction transistor M13 is connected to the second electrode of the first noise-reduction transistor M12, so as to increase reliability of operation of the touch noise-reduction module 60.

A second aspect of the invention provides a driving method of the shift register unit, including:

during an input sub-period (t2 period in FIG. 4), supplying a high-level signal to the input terminal IN of the shift register unit, and supplying a high-level signal to the pull-down node PD of the shift register unit by the second clock signal terminal CKB, making the pull-down node PD and the low-level signal terminal VGL be connected in a conducting path, and making both the pull-up node PU and the output terminal OUT of the shift register unit be connected with the low-level signal terminal VGL in conducting paths;

during an output sub-period after the input sub-period (t3 period in FIG. 4), supplying a high-level signal to the first clock signal terminal CK of the shift register unit to pull potential of the output terminal OUT of the shift register unit up to be at a high level; and during a pull-down sub-period after the output sub-period (t4 period in FIG. 4), supplying a high-level signal to the second clock signal terminal CKB, and making both the pull-up node PU and the output terminal OUT of the shift register unit be connected with the low-level signal terminal VGL in conducting paths.

Thus, during the input sub-period and the pull-down sub-period, the second clock signal terminal CKB pulls up the potential of the pull-down node PD, and at the same time, the first terminal and the second terminal of the discharging module 10 are connected in a conducting path to pull down the potential of the pull-down node PD, so that during the input sub-period and the pull-down sub-period, the potential of the pull-down node PD is lower than the potential of the second clock signal terminal CKB and the potential of the pull-down node PD can make the pull-down module 70 be turned on (that is, make the pull-up node PU and the output terminal OUT be connected with the low-level signal terminal VGL in conducting paths), thus avoiding instability due to the fact that the pull-down node PD is directly risen to the high level from the low level, and increasing stability of the operation of the pull-down module 70. As such, a low-level signal is stably output from the output terminal OUT of the shift register unit, thus reducing noise introduction.

Further, the driving method further includes:

during a reset sub-period before the input sub-period (t1 period in FIG. 4), supplying a high-level signal to the reset terminal RESET of the shift register unit, so as to reset the pull-up node PU and the output terminal OUT of the shift register unit.

Further, the driving method further includes:

during a touch period, making the output terminal OUT and the low-level signal terminal VGL of the shift register unit be connected in a conducting path, so as to reduce noise generated during the touch period and increase the touch accuracy.

Figure 4:
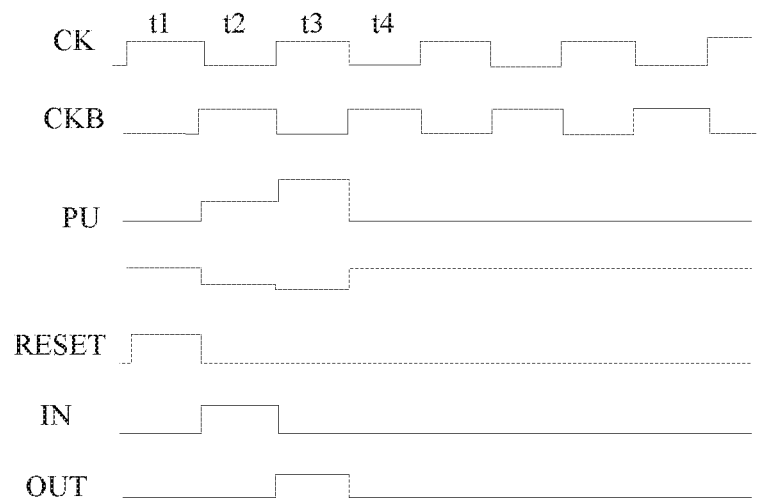
FIG. 4 is a timing diagram illustrating various driving signals of a shift register unit according to an embodiment of the invention.
Figure 5:
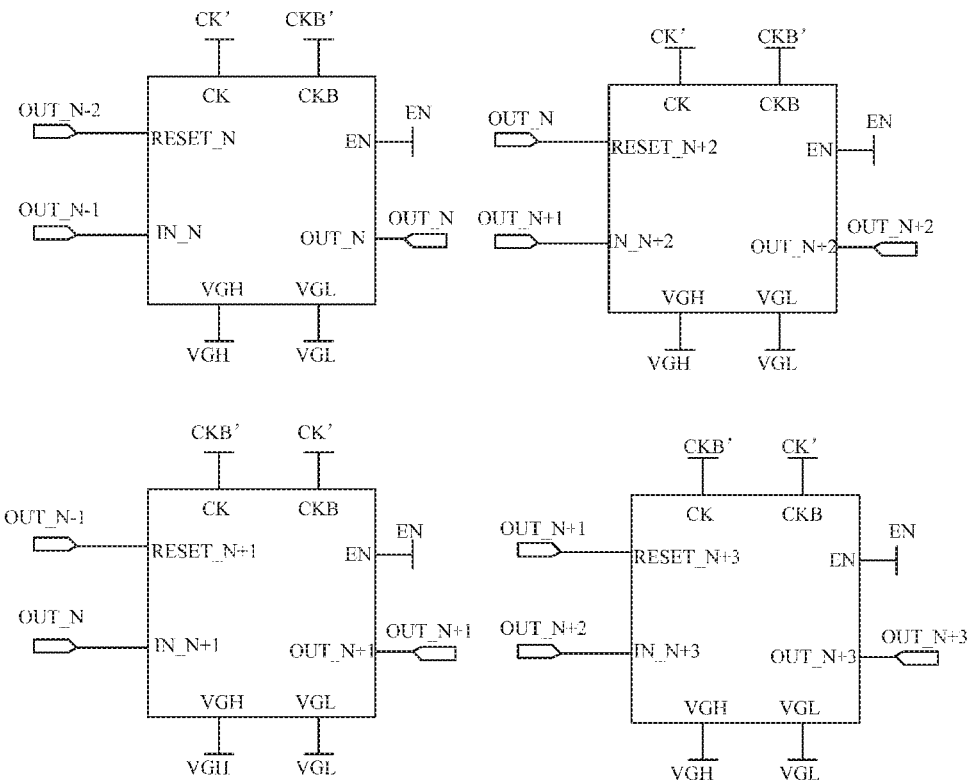
FIG. 5 is a schematic view illustrating connections among a plurality of stages of shift register units according to an embodiment of the invention.

The operation process of the shift register unit of the invention will be described below in conjunction with FIGS. 4 and 5.

During t1 sub-period of the display period, a high-level signal is input to the reset terminal RESET of the shift register unit, and the first reset transistor M8, the second reset transistor M9 and the normally-on transistor M10 are turned on, to pull potentials of the pull-up node PU and the output terminal OUT of the shift register unit down to the low level.

During t2 sub-period of the display period, a high-level signal is input to the second clock signal terminal CKB, the charging transistor M7 is turned on, the second clock signal terminal CKB charges the pull-down node PD, and at the same time, the first discharging transistor M5 is turned on to discharge the pull-down node PD, which is equivalent to the case that the charging transistor M7 and the first discharging transistor M5 divide voltage of the high-level signal so that the potential of the pull-down node PD is smaller than that of the high-level signal at the second clock signal terminal CKB and larger than the threshold voltages of the first pull-down transistor M3 and the second pull-down transistor M4 to make the first pull-down transistor M3 and the second pull-down transistor M4 be turned on, thus the output terminal OUT of the shift register unit is connected with the low-level signal terminal VGL in a conducting path to output the low-level signal. During t2 sub-period, a high-level signal is input to the input terminal IN of the shift register unit, the input transistor M1 is turned on, and the input terminal IN charges the pull-up node PU (the first terminal of the storage capacitor C), which is equivalent to the case that the normally-on transistor M10 and the first pull-down transistor M3 are connected in series, and then are connected to the input transistor M1 in series, to divide the voltage of the high-level signal at the input terminal IN, so that the potential of the pull-up node PU is lower than that of the input terminal IN and larger than the threshold voltage of the first pull-up transistor M2.

Thus, during t2 sub-period, the potentials of the pull-up node PU and the pull-down node PD are not directly charged by the high-level signals of the input terminal IN and the second clock signal terminal CKB to the larger potentials, but are risen to potentials lower than those of the high-level signals under the combining effect of charging and discharging, thus reducing drift of the potential, increasing stability of the potentials of the pull-up node PU and the pull-down node PD, increasing stability of operations of the transistors controlled by the pull-up node PU and the pull-down node PD, and in turn increasing output stability of the shift register unit, effectively prohibiting noise and reducing power-consumption.

During t3 sub-period, a high-level signal is input to the first clock signal terminal CK, and under the bootstrap effect of the storage capacitor C, the potential of the pull-up node PU is further risen to make the first pull-up transistor M2 and the second pull-up transistor M11 be turned on, and a high-level signal is output by the output terminal OUT of the shift register unit; at the same time, the second discharging transistor M6 is turned on under the control of the pull-up node PU, and a low-level signal is input to the pull-down node PD by the second clock signal terminal CKB, and as such, the potential of the pull-down node PD is pulled down to a low level, and the first pull-down transistor M3 and the second pull-down transistor M4 are turned off.

During t4 sub-period, a low-level signal is input to the first clock signal terminal CK, and the second clock signal terminal CKB charges the pull-down node PD by the charging transistor M7, and as this time, the first pull-down transistor M3 is turned on to pull down the potential of the pull-up node PU, and the second pull-down transistor M4 is turned on to pull down the potential of the output terminal OUT of the shift register unit.

A third aspect of the invention provides a gate driving circuit, including a plurality of stages of shift register units which are cascaded, wherein the shift register unit is the above shift register unit according to the invention.

Figure 6:
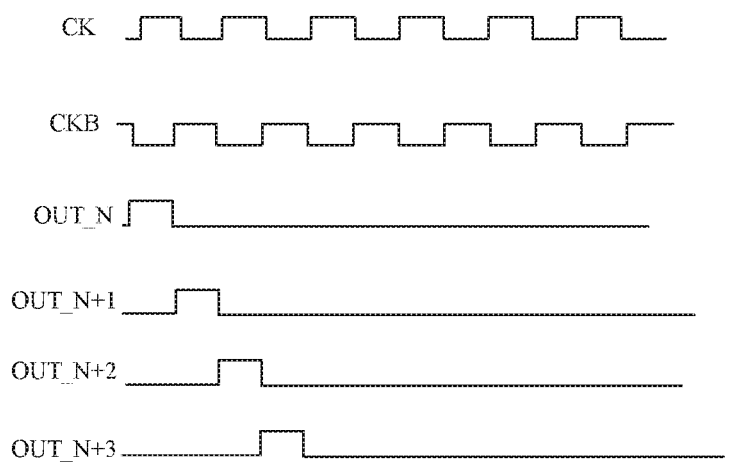
FIG. 6 is a timing diagram illustrating various output signals of the plurality of stages of shift register units according to the embodiment of the invention.

In particular, the shift register unit has the first clock signal terminal and the second clock signal terminal, and in continuous three stages of shift register units, an input terminal of a third stage of shift register unit is connected to an output terminal of a second stage of shift register unit, and a reset terminal of the third stage of shift register unit is connected to an output terminal of the first stage of shift register unit. As shown in FIG. 5, an input terminal IN_N+2 of the (N+2)$^{th}$ stage of shift register unit is connected to the output terminal OUT_N+1 of the (N+1)$^{th}$ stage of shift register unit, and a reset terminal RESET_N+2 of the (N+2)$^{th}$ stage of shift register unit is connected to an output terminal OUT_N of the N$^{th}$ stage of shift register unit, so that the plurality of stages of shift register units sequentially output high-level signals, as shown in FIG. 6. It should be understood that, signals input to the first clock signal terminals of two adjacent stages of shift register units have opposite polarities, and signals input to the second clock signal terminals of two adjacent stages of shift register units also have opposite polarities. As shown in FIG. 5, the first clock signal terminal CK of the N$^{th}$ stage of shift register unit is connected to a first clock signal line CK' supplying a first clock signal, and the second clock signal terminal CKB of the N$^{th}$ stage of shift register unit is connected to a second clock signal line CKB' supplying a second clock signal; and the first clock signal terminal CK of the (N+1)$^{th}$ stage of shift register unit is connected to a second clock signal line CKB' supplying a second clock signal, and the second clock signal terminal CKB of the (N+1)$^{th}$ stage of shift register unit is connected to a first clock signal line CK' supplying a first clock signal.

A fourth aspect of the invention provides a display device including the above gate driving circuit provided by the invention.

The display device provided by the invention may be a touch display device, which may further include a touch driving electrode, a touch sensing electrode and a touch circuit which is configured to sense a touch position during the touch period. As mentioned above, the shift register unit further comprises the touch noise-reduction module 60, a first terminal of the touch noise-reduction module 60 is connected to the touch enable terminal EN which is able to supply a high-level signal during the touch period, a second terminal of the touch noise-reduction module 60 is connected to the output terminal OUT of the shift register unit, a third terminal of the touch noise-reduction module 60 is connected to the low-level signal terminal VGL, and when the first terminal of the touch noise-reduction module 60 receives a high-level signal, the second and third terminals of the touch noise-reduction module 60 are connected in a conducting path, to prevent noise from generating during the touch period, and in turn increase the touch sensitivity.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:

1. A shift register unit, comprising a pull-up node, a pull-down node, a low-level signal terminal, a second clock signal terminal and a pull-down module,
    wherein the second clock signal terminal supplies a high-level signal to the pull-down node during an input sub-period and a pull-down sub-period of the shift register unit, and the pull-down module is connected to the pull-up node, the pull-down node, an output terminal of the shift register unit and the low-level signal terminal, and
    wherein the shift register unit further comprises a discharging module, which is connected to the pull-down node and the low-level signal terminal and configured to make the pull-down node and the low-level signal terminal be connected in a conducting path during the input sub-period, and with a potential of the pull-down node, the pull-down module makes both the pull-up node and the output terminal of the shift register unit be connected with the low-level signal terminal in conducting paths during the input sub-period and the pull-down sub-period,
    the shift register unit further comprises a reset module, which is configured to reset the pull-up node and the output terminal of the shift register unit during a reset sub-period before start of the input sub-period,
    the reset module comprises a first reset transistor, a second reset transistor and a normally-on transistor, both a gate of the first reset transistor and a gate of the second reset transistor are connected to a reset terminal of the shift register unit, a gate of the normally-on transistor is connected to a high-level signal terminal, a first electrode of the normally-on transistor is connected to the pull-up node, a second electrode of the normally-on transistor is connected to a first electrode of the first reset transistor, a second electrode of the first reset transistor is connected to the low-level signal terminal, a first electrode of the second reset transistor is connected to the output terminal of the shift register unit, and a second electrode of the second reset transistor is connected to the first electrode of the normally-on transistor.

2. The shift register unit of claim 1, wherein the pull-down module comprises a first pull-down transistor and a second pull-down transistor, a first electrode of the first pull-down transistor is connected to the pull-up node, a first electrode of the second pull-down transistor is connected to the output terminal of the shift register unit, both a gate of the first pull-down transistor and a gate of the second pull-down transistor are connected to the pull-down node, and both a second electrode of the first pull-down transistor and a second electrode of the second pull-down transistor are connected to the low-level signal terminal, and
    the discharging module is connected to at least one of an input terminal of the shift register unit and the pull-up node, and when the at least one of the input terminal of the shift register unit and the pull-up node connected to the discharging module supplies a high-level signal to the discharging module, the discharging module is able to make the pull-down node and the low-level signal terminal be connected in a conducing path.

3. The shift register unit of claim 1, wherein the shift register unit further comprises a pull-up module and a first clock signal terminal, a first terminal of the pull-up module is connected to the pull-up node, a second terminal of the pull-up module is connected to the first clock signal terminal, a third terminal of the pull-up module is connected to the output terminal of the shift register unit, and when a high-level signal is received by the first terminal of the pull-up module, the second and third terminals of the pull-up module are connected in a conducting path; and
    wherein the shift register unit further comprises a storage module arranged between the pull-up node and the output terminal of the shift register unit, and the storage module is configured to make potentials between the pull-up node and the output terminal of the shift register unit during the input sub-period and an output sub-period after the input sub-period be identical when a high-level signal is input to the first clock signal terminal.

4. The shift register unit of claim 3, wherein the pull-up module comprises a first pull-up transistor and a second pull-up transistor, a gate of the first pull-up transistor and a gate of the second pull-up transistor are connected to each other and act as a first terminal of the pull-up module, a first electrode of the first pull-up transistor and a first electrode of the second pull-up transistor are connected to each other and act as a second terminal of the pull-up module, and a second electrode of the first pull-up transistor and a second electrode of the second pull-up transistor are connected to each other and act as a third terminal of the pull-up module;
    the storage module comprises a coupling capacitor formed between the gate and the second electrode of the first pull-up transistor and a coupling capacitor formed between the gate and the second electrode of the second pull-up transistor.

5. The shift register unit of claim 4, wherein the storage module further comprises a storage capacitor, a first terminal of the storage capacitor is connected to the pull-up node, and a second terminal of the storage capacitor is connected to the output terminal of the shift register unit.

6. The shift register unit of claim 1, further comprising an input module, wherein the input module is connected to an input terminal and the pull-up node of the shift register unit to charge the pull-up node during the input sub-period.

7. The shift register unit of claim 6, wherein the input module comprises an input transistor, both a gate and a first electrode of the input transistor are connected to the input terminal of the shift register unit, and a second electrode of the input transistor is connected to the pull-up node.

8. The shift register unit of claim 1, wherein the shift register unit further comprises a touch noise-reduction module, a first terminal of the touch noise-reduction module is connected to a touch enable terminal which is able to supply a high-level signal during a touch period, a second terminal of the touch noise-reduction module is connected to the output terminal of the shift register unit, a third terminal of the touch noise-reduction module is connected to the low-level signal terminal, and when the first terminal of the touch noise-reduction module receives a high-level signal, the second and third terminals of the touch noise-reduction module are connected in a conducting path.

9. The shift register unit of claim 8, wherein the touch noise-reduction module comprises a first noise-reduction transistor, a gate of the first noise-reduction transistor acts as the first terminal of the touch noise-reduction module, a first electrode of the first noise-reduction transistor acts as the second terminal of the touch noise-reduction module, and a second electrode of the first noise-reduction transistor acts as the third terminal of the touch noise-reduction module.

10. The shift register unit of claim 9, wherein the touch noise-reduction module further comprises a second noise-reduction transistor, a gate of the second noise-reduction transistor is connected to the gate of the first noise-reduction transistor, a first electrode of the second noise-reduction transistor is connected to the first electrode of the first noise-reduction transistor, and a second electrode of the second noise-reduction transistor is connected to the second electrode of the first noise-reduction transistor.

11. A driving method of the shift register unit of claim 1, comprising:
during an input sub-period, supplying a high-level signal to the input terminal of the shift register unit, supplying a high-level signal to the pull-down node of the shift register unit by the second clock signal terminal, making the pull-down node and the low-level signal terminal be connected in a conducting path, and making both the pull-up node and the output terminal of the shift register unit be connected with the low-level signal terminal in conducting paths;
during an output sub-period after the input sub-period, supplying a high-level signal to the first clock signal terminal of the shift register unit to pull potential of the output terminal of the shift register unit up to be at a high level; and
during a pull-down sub-period after the output sub-period, supplying a high-level signal to the second clock signal terminal, and making both the pull-up node and the output terminal of the shift register unit be connected with the low-level signal terminal in conducting paths.

12. The driving method of claim 11, further comprising:
during a reset sub-period before the input sub-period, supplying a high-level signal to the reset terminal of the shift register unit, so as to reset the pull-up node and the output terminal of the shift register unit.

13. A gate driving circuit, comprising a plurality of stages of shift register units which are cascaded, wherein the shift register unit is the shift register unit of claim 1.

14. A display device, comprising the gate driving circuit of claim 13.

15. The shift register unit of claim 1, wherein the discharging module comprises a first discharging transistor and a second discharging transistor, a gate of the first discharging transistor is connected to an input terminal of the shift register unit, a gate of the second discharging transistor is connected directly to the pull-up node, both a first electrode of the first discharging transistor and a first electrode of the second discharging transistor are connected to the pull-down node, and both a second electrode of the first discharging transistor and a second electrode of the second discharging transistor are connected to the low-level signal terminal.

16. The shift register unit of claim 1, further comprising a pull-down node charging module having an internal resistor, wherein an input terminal of the pull-down node charging module is connected to the second clock signal terminal and an output terminal of the pull-down node charging module is connected to the pull-down node.

17. The shift register unit of claim 16, wherein the pull-down node charging module comprises a charging transistor, a gate and a first electrode of the charging transistor are connected to each other and act as an input terminal of the pull-down node charging module, and a second electrode of the charging transistor acts as an output terminal of the pull-down node charging module.

* * * * *